(12) United States Patent
Kusunoki et al.

(10) Patent No.: US 7,611,916 B2
(45) Date of Patent: Nov. 3, 2009

(54) METHOD OF MANUFACTURING SEMICONDUCTOR OPTICAL ELEMENT

(75) Inventors: Masatsugu Kusunoki, Tokyo (JP); Takafumi Oka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/397,978

(22) Filed: Mar. 4, 2009

(65) Prior Publication Data

US 2009/0227055 A1  Sep. 10, 2009

(30) Foreign Application Priority Data

Mar. 5, 2008 (JP) ............... 2008-055388

(51) Int. Cl.
*H01L 21/00* (2006.01)
(52) U.S. Cl. ............... 438/31; 438/32; 257/98; 257/E21.001
(58) Field of Classification Search ............ None
See application file for complete search history.

(56) References Cited

U.S. PATENT DOCUMENTS

| | | | |
|---|---|---|---|
| 5,173,447 A * | 12/1992 | Ijichi et al. ............... 438/41 |
| 5,658,823 A * | 8/1997 | Yang ............... 438/38 |
| 6,171,876 B1 | 1/2001 | Yuang et al. |
| 6,278,720 B1 * | 8/2001 | Lee et al. ............... 372/46.01 |
| 6,335,216 B1 * | 1/2002 | Yoshida et al. ............... 438/40 |
| 6,642,075 B2 * | 11/2003 | Takiguchi ............... 438/32 |
| 6,711,191 B1 | 3/2004 | Kozaki et al. |
| 7,263,760 B2 * | 9/2007 | Peterson et al. ............... 29/600 |
| 7,421,000 B2 | 9/2008 | Taneya et al. |
| 7,447,248 B2 * | 11/2008 | Miyajima et al. ......... 372/45.01 |
| 7,456,039 B1 * | 11/2008 | Kawasaki et al. ............ 438/31 |

2008/0090315 A1 * 4/2008 Abe et al. ............... 438/31

FOREIGN PATENT DOCUMENTS

| | | |
|---|---|---|
| EP | 1 005 124 A2 | 5/2000 |
| JP | 04-147685 A | 5/1992 |
| JP | 04-329688 A | 11/1992 |
| JP | 09-036389 A | 2/1997 |
| JP | 2000-012970 A | 1/2000 |
| JP | 2000-022261 A | 1/2000 |
| JP | 2000-114664 A | 4/2000 |
| JP | 2000-164987 A | 6/2000 |
| JP | 2000-315838 A | 11/2000 |

(Continued)

*Primary Examiner*—Zandra Smith
*Assistant Examiner*—Khanh B Duong
(74) *Attorney, Agent, or Firm*—Leydig, Voit & Mayer, Ltd.

(57) ABSTRACT

A method of manufacturing a semiconductor optical element, includes successively stacking a first semiconductor layer of a first conductivity type, an active layer, and a second semiconductor layer of a second conductivity type; applying a resist to the second semiconductor layer and patterning the resist into stripes by photolithography; forming recesses in the second semiconductor layer and a waveguide ridge adjacent to the recesses by dry-etching the second semiconductor layer only partially through the second semiconductor layer, using the resist as a mask; forming an insulating film on the waveguide ridge and in the recesses while leaving the resist; removing the insulating film from the resist so that the resist is exposed while the insulating film in the recess is left; removing the resist exposed; and forming an electrode on the waveguide ridge after removing the resist.

2 Claims, 4 Drawing Sheets

FOREIGN PATENT DOCUMENTS

| | | |
|---|---|---|
| JP | 2000-340880 A | 12/2000 |
| JP | 2002-171028 A | 6/2002 |
| JP | 2002-208753 A | 7/2002 |
| JP | 2002-335043 A | 11/2002 |
| JP | 2003-046193 A | 2/2003 |
| JP | 2003-142769 A | 5/2003 |
| JP | 2004-253545 A | 9/2004 |
| WO | WO 03/085790 A1 | 10/2003 |

* cited by examiner

METHOD OF MANUFACTURING SEMICONDUCTOR OPTICAL ELEMENT

BACKGROUND OF THE INVENTION

1. Field of the Invention

The present invention relates to a method of manufacturing a semiconductor optical element having an electrode formed on the top of a waveguide ridge and, more particularly, to a semiconductor optical element manufacturing method capable of preventing a reduction in the area of contact between a semiconductor layer and an electrode on the waveguide ridge top by means of a simple process, and preventing the semiconductor layer on the waveguide ridge top from being damaged by etching.

2. Background Art

In recent years, research and development of nitride-based semiconductor lasers using nitride-based III-V-group compound semiconductors such as AlGaInN as semiconductor lasers capable of light emission in the blue region to ultraviolet region necessary for increasing the density of optical disks have been aggressively conducted, and such semiconductor lasers have been put to practical use.

Such a blue-violet LD (a laser diode abbreviated as LD hereinafter) is formed by crystal-growing a compound semiconductor on a GaN substrate. The compound semiconductor is typically a III-V-group compound semiconductor in which a III-group element and a V-group element are combined. Mixed-crystal compound semiconductors are obtained by combining III-group atoms and V-group atoms in various composition ratios. Compound semiconductors used for blue-violet LDs are, for example, GaN, GaPN, GaNAs, InGaN and AlGaN.

In a waveguide-ridge-type LD, a waveguide ridge is covered with an insulating film. An opening is provided in the insulating film at the top of the waveguide ridge. Through this opening, an electrode is connected to a contact layer which is the uppermost layer of the waveguide ridge.

The opening in the insulating film is formed by a lift-off method using a resist mask used at the time of forming the waveguide ridge. This resist mask is recessed along the surface of the contact layer. Therefore, part of the insulating film remains in the recess even after lift-off. There is a problem that the area of contact through which the electrode contacts the contact layer is reduced relative to the entire surface area of the contact layer at the waveguide ridge top by the residual insulating film.

In a red LD, GaAs or the like having a comparatively low contact resistance is used as the material of a contact layer and, therefore, the contact resistance with an electrode is not largely increased even if the contact area is reduced. In a blue-violet LD, however, GaN or the like having a comparatively high contact resistance is used as the material of a contact layer and, therefore, the contact resistance with an electrode is largely increased with reduction in contact area, resulting in increase in operating voltage.

To solve this problem, a method described below has been proposed. First, an electrode is formed on a semiconductor multilayer structure. Next, a resist is formed on the electrode, the electrode is etched, and the semiconductor multilayer structure is etched to an intermediate position therein to form a waveguide ridge. Next, an insulating film is formed on the wafer upper surface while the resist is left. The resist is then removed to expose the upper surface of the waveguide ridge. A p-type pad electrode is thereafter formed so as to cover the electrode (see, for example, lines 42 to 50 on page 9 and FIG. 1 of WO2003/085790).

A method described below has also been proposed. First, a portion of a semiconductor multilayer structure is etched to form a waveguide ridge. Next, an insulating film is formed on the surface of the waveguide ridge. Next, a lower-layer resist and an upper-layer resist are successively formed on the insulating film. A resist which reacts only with light having a wavelength shorter than 300 nm is used as the lower-layer resist, and a resist which reacts only with light having a wavelength equal to or longer than 300 nm is used as the upper-layer resist. The upper-layer resist is patterned so that the lower-layer resist in the vicinity of the waveguide ridge is exposed. The lower-layer resist is then patterned so that the insulating film on the waveguide ridge is exposed. Etching is thereafter performed to remove the insulating film on opposite sides of the waveguide ridge. The remaining lower-layer resist and upper-layer resist are then removed and a metal layer is deposited as an electrode (see, for example, paragraphs 0024 to 0034 and FIGS. 7 to 18 of Japanese Patent Laid-Open No. 2000-22261).

A method described below has also been proposed. First, a contact layer is etched by using a metal mask. Next, a semiconductor multilayer structure is etched to form a waveguide ridge, with the contact layer used as a mask, while the metal mask is left. Next, an insulating film is formed on the entire surface, and the metal mask and the insulating film formed on the metal mask are removed by lift-off. Next, a resist through which a p-side electrode is exposed is formed by lithography. An electrode material is vacuum-deposited by using this resist as a mask. The resist and the electrode material on the resist are then removed by lift-off, thereby forming an electrode which contacts the contact layer of the waveguide ridge (see, for example, paragraphs 0025 to 0034 and FIG. 1 of Japanese Patent Laid-Open No. 2000-340880).

A method described below has also been proposed. First, a first protective film is formed on a contact layer and a second protective film in stripe form is formed on the first protective film. Next, the first protective film is etched while maintaining the second protective film, and the second protective film is thereafter removed, thereby forming the first protective film in stripe form. Next, the semiconductor multilayer structure is etched to an intermediate position therein by using the first protective film as a mask, thereby forming a waveguide ridge. Next, a third protective film of an insulating material different from the first protective film is formed on the side surfaces of the waveguide ridge and on the flat surface of the semiconductor layer exposed by etching. Only the first protective film is thereafter removed by lift-off and an electrode electrically connected to the contact layer is formed on the third protective film and the contact layer (see, for example, paragraphs 0020 to 0027 and FIG. 1 of Japanese Patent Laid-Open No. 2003-142769).

A reduction in the area of contact between the contact layer of the waveguide ridge and the electrode can be prevented by each of these methods. However, each method includes a complicated step, such as the step of simultaneously etching a metal electrode and a semiconductor layer, the step in which when resists in two layers are used, etching of the upper-layer resist is stopped while leaving the lower-layer resist, the step of using a metal mask, or the step of performing lift-off when a plurality of protective films are used. Therefore, devices uniform in characteristics cannot be steadily manufactured by any of the above-described methods, and the degree of process freedom has been low.

To prevent a reduction in the area of contact between a contact layer of a waveguide ridge and an electrode while using a simple process, a method described below has been proposed. First, channels are formed in a wafer having semiconductor layers stacked, thereby forming a waveguide ridge. Next, $SiO_2$ film is formed on the entire wafer surface. Next, a resist is formed so that the film thickness is larger in the channels than at the waveguide ridge top. The resist on the top of the waveguide ridge is then removed by dry etching while leaving the resist in the channels. Next, the $SiO_2$ film formed on the top of the waveguide ridge is reliably removed by performing etching using the resist as a mask, while leaving the $SiO_2$ film formed on the side surfaces and bottoms of the channels. The resist is thereafter removed and an electrode is formed on the top of the waveguide ridge.

A method described below has also been proposed. First, a metal layer in stripe form is formed on the upper surface of a p-type contact layer. Next, a p-side ohmic electrode is formed by performing a heat treatment (alloying). Next, etching is performed by using the p-side ohmic electrode as a mask and using $Cl_2$ as etching gas until the p-type guide layer is exposed (see, for example, paragraphs 0035 to 0038 and FIG. 2 of Japanese Patent Laid-Open No. 2004-253545).

A method described below has also been proposed. First, a first protective film formed of a Silicon oxide is formed on the entire surface of a p-side contact layer and a third protective film in stripe form is formed on the first protective film. Next, the first protective film is etched while maintaining the third protective film, and the third protective film is thereafter removed, thereby forming the first protective film in stripe form. Next, the p-side contact layer is etched from portions on which the first protective film is not formed, thereby forming a waveguide region in stripe form immediately below the first protective film in conformity with the shape of the protective film. Next, a second protective film of an insulating material different from the first protective film is formed on the side surfaces of the waveguide in stripe form, on the flat surface of a nitride semiconductor layer (p-side clad layer) exposed by etching and on the first protective film. The first protective film is thereafter removed by dry etching using fluoric acid for example. Only the second protective film formed on the first protective film is thereby removed, while the second protective film is continuously formed on the side surfaces of the stripe and on the flat surface of the p-side clad layer (see, for example, paragraphs 0018 to 0024 and FIG. 6 of Japanese Patent Laid-Open No. 2000-114664).

A method described below has also been proposed. First, an epitaxially grown layer of a GaN-based material is formed on a sapphire substrate, and a first mask ($SiO_2$ film) in stripe form is formed on a p-GaN contact layer formed as the uppermost layer. Next, dry etching is performed by using the first mask as a mask to form a waveguide ridge stripe. Next, an AlGaN buried layer is nonselectively formed on opposite sides of the waveguide ridge stripe and on the first mask, a second mask ($SiO_2$ film) is formed on the AlGaN buried layer, and a resist is formed by spin coating. This resist has a reduced thickness portion corresponding to the $SiO_2$ film on the top of the waveguide ridge stripe relative to the opposite sides of the waveguide ridge stripe. Next, the resist of the portion corresponding to the waveguide ridge stripe portion is removed by dry etching using oxygen gas for example, thereby exposing the second mask. The exposed second mask is selectively etched by using $CF_4$ to expose the AlGaN buried layer. Next, the remaining resist is removed by ashing to expose the second mask. Wet etching is performed by using this second mask as a mask to remove the AlGaN buried layer, thereby exposing the first mask on the waveguide ridge top. Next, the first mask and the second mask are removed by wet etching (see, for example, paragraphs 0030 to 0040 and FIGS. 2 to 12 of Japanese Patent Laid-Open No. 2000-164987).

A method described below has also been proposed. First, a GaN-based multilayer structure is formed on a sapphire substrate by MOCVD or the like. Next, an electrode in stripe form is formed on a contact layer in this multilayer structure. Next, a waveguide ridge is formed by using the electrode as a mask. Next, an insulating layer is formed on opposite sides of the waveguide ridge and so as to cover the opposite side surfaces of a clad layer included in the waveguide ridge and lower portions of the opposite side surfaces of a contact layer. A resist is then applied on the insulating layer. This resist is formed so as to have a reduced thickness on the waveguide ridge and an increased thickness on the opposite sides of the waveguide ridge and have top surfaces substantially flush with each other. Next, the top surface and opposite side surfaces of the electrode and upper portions of the opposite side surfaces of the contact layer are exposed by etching, and a metal film in stripe form having the same width as that of the mesa structure is formed (see, for example, paragraphs 0064 to 0073 and FIGS. 3 to 6 of Japanese Patent Laid-Open No. 2002-335043).

SUMMARY OF THE INVENTION

In the conventional methods, a waveguide ridge is first formed and is covered with $SiO_2$ film. Subsequently, a resist is applied to the entire surface and the resist on the waveguide ridge top is removed while leaving the resist in the channels. Subsequently, the exposed $SiO_2$ film is uniformly etched from the surface by using the resist as a mask to remove the $SiO_2$ film on the top of the waveguide ridge while leaving the $SiO_2$ film on the side surfaces and bottoms of the channels, thereby forming an opening in the $SiO_2$ film at the top of the waveguide ridge.

However, if dry etching is used at the time of removing the $SiO_2$ film, the semiconductor layer on the top of the waveguide ridge covered with the $SiO_2$ film is damaged by etching. For example, if the semiconductor layer on the waveguide ridge top is a p-type contact layer, the contact resistance is increased. Further, if the p-type contact layer is formed of a GaN-based material, it is difficult to remove the damaged portion by wet etching because the GaN-based material is difficult to be wet-etched.

In view of the above-described problems, an object of the present invention is to provide a method of manufacturing a semiconductor optical element capable of preventing a reduction in the area of contact between a semiconductor layer and an electrode on the waveguide ridge top by means of a simple process, and preventing the semiconductor layer on the waveguide ridge top from being damaged by etching.

According to one aspect of the present invention, a method of manufacturing a semiconductor optical element, comprises the steps of: successively stacking a first semiconductor layer of a first conduction type, an active layer and a second semiconductor layer of a second conduction type; applying a resist on the second semiconductor layer and patterning the resist into stripes by photolithography; forming recesses in which the second semiconductor layer is left at the bottom and a waveguide ridge adjacent to the recesses by dry-etching the second semiconductor layer to an intermediate position in the second semiconductor layer with the resist used as a mask; forming an insulating film on the waveguide ridge and the recesses while leaving the resist; removing the insulating film formed on the resist by utilizing a difference in etching rate between the insulating film formed on the resist and the insulating film formed on the recesses so that the resist is exposed while the insulating film formed on the recess is left; removing the exposed resist; and forming an electrode on the top of the waveguide ridge after removing the resist.

The present invention enables preventing a reduction in the area of contact between the semiconductor layer and the electrode on the top of the waveguide ridge by means of a simple process, and preventing the semiconductor layer on the top of the waveguide ridge from being damaged by etching.

Other and further objects, features and advantages of the invention will appear more fully from the following description.

DETAILED DESCRIPTION OF THE PREFERRED EMBODIMENT

A method of manufacturing a semiconductor optical element according to the embodiment of the present invention will be described below with reference to the accompanying drawings.

Figure 1:
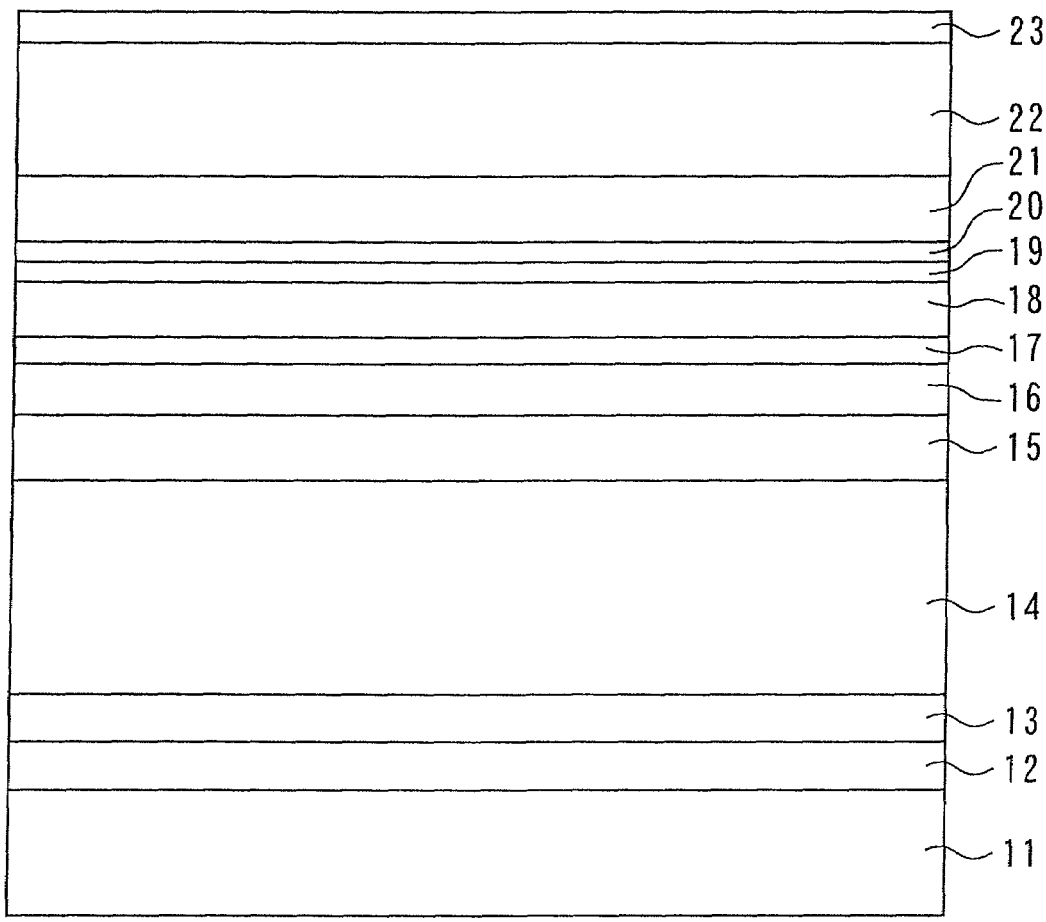
FIGS. 1-10 are sectional views for explaining a method of manufacturing a semiconductor optical element according to an embodiment of the present invention.

First, as shown in FIG. 1, a buffer layer 12 formed of an n-type GaN is formed by metal organic chemical vapor deposition (MOCVD) at a growth temperature of, for example, 1000° C. on a Ga surface which is one major surface of an n-type GaN substrate 11 (substrate) whose surface is cleaned in advance by thermal cleaning or the like. The film thickness of the n-type GaN substrate 11 is about 100 µm. The film thickness of the buffer layer 12 is about 1 µm.

On the buffer layer 12 are successively stacked an n-type clad layer 13, an n-type clad layer 14, an n-type clad layer 15, an n-side light guide layer 16, an n-side separate confinement heterostructure (SCH) layer 17, an active layer 18, a p-side SCH layer 19, an electron barrier layer 20, a p-side light guide layer 21, a p-type clad layer 22 and a contact layer 23.

The n-type clad layer 13 is formed of n-type $Al_{0.07}Ga_{0.93}N$ with a layer thickness of 400 nm. The n-type clad layer 14 is formed of n-type $Al_{0.045}Ga_{0.955}N$ with a layer thickness of 1000 nm. The n-type clad layer 15 is formed of n-type $Al_{0.015}Ga_{0.985}N$ with a layer thickness of 300 nm. The n-side light guide layer 16 is formed of undoped $In_{0.02}Ga_{0.98}N$ with a layer thickness of 80 nm. The n-side SCH layer 17 is formed of undoped $In_{0.02}Ga_{0.98}N$ with a film thickness of 30 nm.

The active layer 18 is a double quantum well structure in which a well layer of undoped $In_{0.12}Ga_{0.88}N$ with a layer thickness of 5 nm, a barrier layer of undoped $In_{0.02}Ga_{0.98}N$ with a layer thickness of 8 nm and a well layer of undoped $In_{0.12}Ga_{0.88}N$ with a layer thickness of 5 nm are successively stacked on the n-side SCH layer 17.

The p-side SCH layer 19 is formed of undoped $In_{0.02}Ga_{0.98}N$ with a film thickness of 30 nm. The electron barrier layer 20 is formed of p-type $Al_{0.2}Ga_{0.8}N$ with a layer thickness of 20 nm. The p-side light guide layer 21 is formed of p-type $Al_{0.2}Ga_{0.8}N$ with a layer thickness of 100 nm. The p-type clad layer 22 is formed of p-type $Al_{0.07}Ga_{0.93}N$ with a layer thickness of 500 nm. The contact layer 23 is formed of p-type GaN with a layer thickness of 20 nm.

The n-type clad layers 13 to 15 are first semiconductor layers of an n-type (first conduction type), while the p-type clad layer 22 and the contact layer 23 are second semiconductor layers of a p-type (second conduction type). A second semiconductor layer may be of single layer or three or more layers. Si is used as an n-type impurity, and Mg is used as a p-type impurity.

Figure 2:
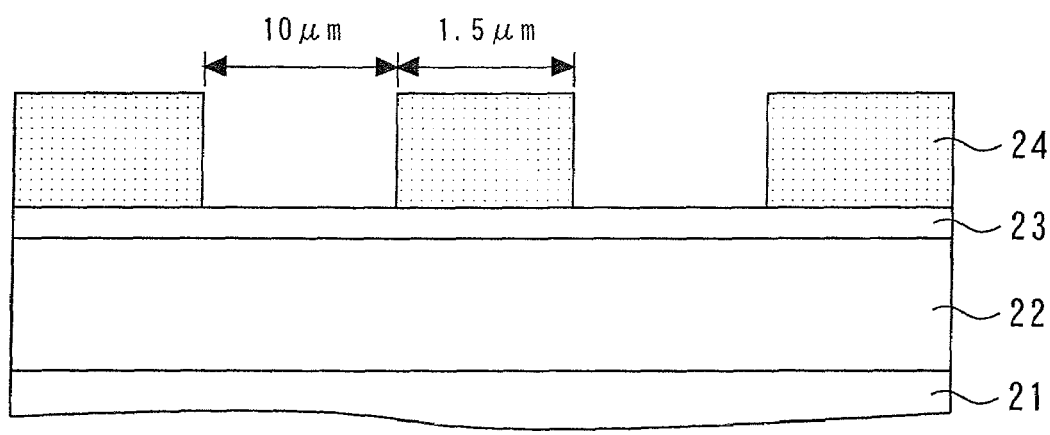

Next, as shown in FIG. 2, a resist 24 is applied on the contact layer 23 and is patterned into stripes by photolithography. The width of each stripe of resist 24 is 1.5 µm and the distance between the stripes of resist 24 is 10 µm. The layers below the p-side light guide layer 21 are omitted in FIG. 2 because no change is made therein.

Figure 3:
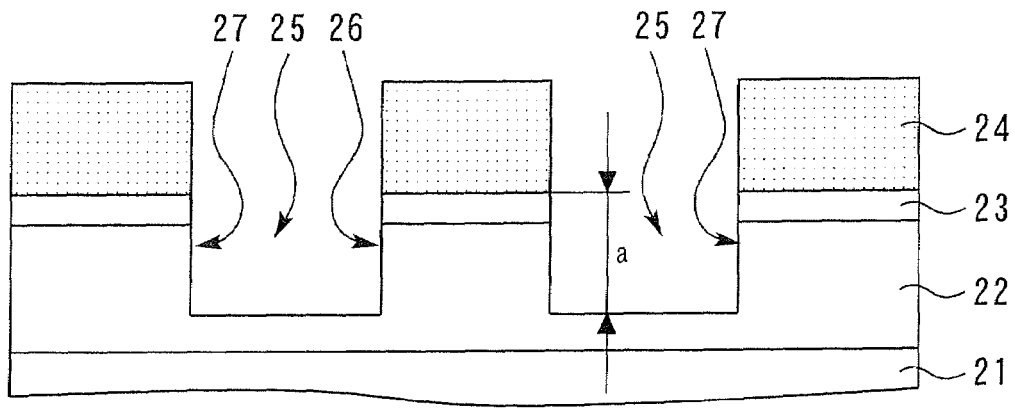

Next, as shown in FIG. 3, the contact layer 23 and the p-type clad layer 22 are dry-etched to an intermediate position in the p-type clad layer 22, for example, by reactive ion etching (RIE), with the resist 24 used as a mask. Channels 25 (recesses) with the p-type clad layer 22 left in its bottom portion and a waveguide ridge 26 and electrode pad bases 27 adjacent to the channels 25 are thereby formed.

The waveguide ridge 26 is disposed at a center in the width direction of a cleaved end surface being a resonator end surface of a laser diode and extends between two cleaved end surface portions being the resonator end surface. The size of the waveguide ridge 26 in the longitudinal direction, i.e., the resonator length, is 1000 µm, and the waveguide ridge width in a direction perpendicular to the longitudinal direction is one to several ten microns, e.g., 1.5 µm. The electrode pad bases 27 are base formed on opposite sides of the waveguide ridge 26 with the channels 25 interposed therebetween. The height "a" of the waveguide ridge 26 from the bottom of the channels 25 is about 500 nm (0.5 µm). The width of each channel 25 is 10 µm.

Figure 4:
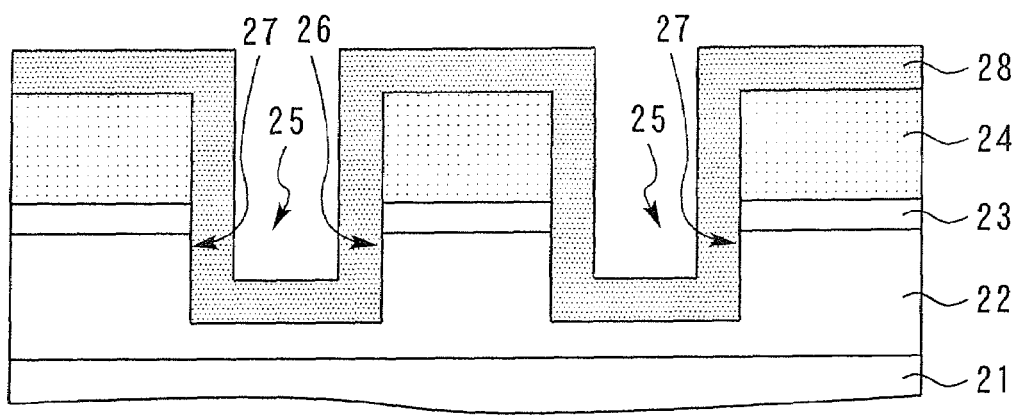

Next, as shown in FIG. 4, an $SiO_2$ film 28 (insulating film) is formed on the channels 25, the waveguide ridge 26 and the electrode pad bases 27 by CVD, sputtering, vapor deposition or the like while the resist 24 is left. The film thickness of the $SiO_2$ film 28 is 0.2 µm. The $SiO_2$ film 28 covers the upper and side surfaces of the resist 24 left on the waveguide ridge 26 and the electrode pad bases 27, and the bottom and side surfaces of the channels 25.

The density of the $SiO_2$ film 28 formed on the resist 24 is not as high as the density of the $SiO_2$ film 28 formed on the channels 25, i.e., on the p-type clad layer 22 and the contact layer 23. Therefore, the rate at which the $SiO_2$ film 28 on the resist 24 is etched is higher than the rate at which the $SiO_2$ film 28 on the channels 25 is etched. In particular, if the $SiO_2$ film 28 is formed by sputtering, the difference between these etching rates is large.

Figure 5:
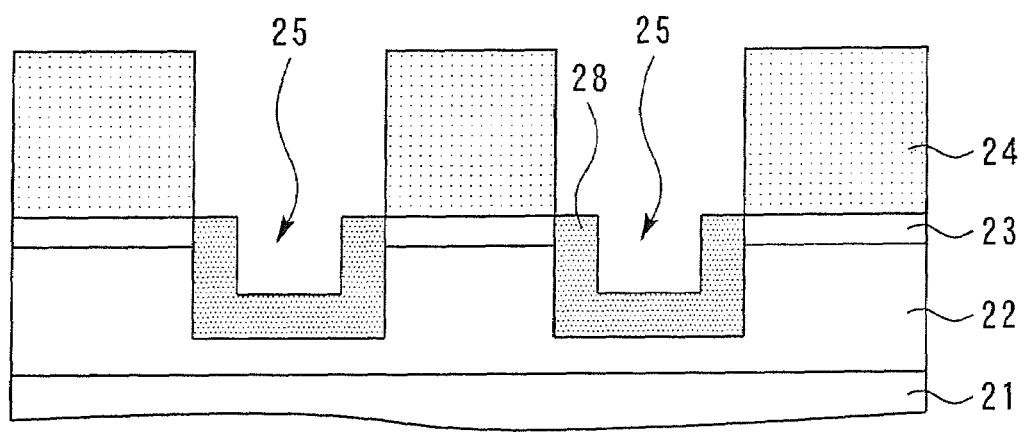

As shown in FIG. 5, the $SiO_2$ film 28 formed on the resist 24 is removed by utilizing this difference in etching rate and by performing wet etching using buffered fluoric acid or the like so that the resist 24 is exposed while the $SiO_2$ film 28 formed on the channels 25 is left. Dry etching using $CF_4$ gas or the like may be performed instead of wet etching.

Figure 6:
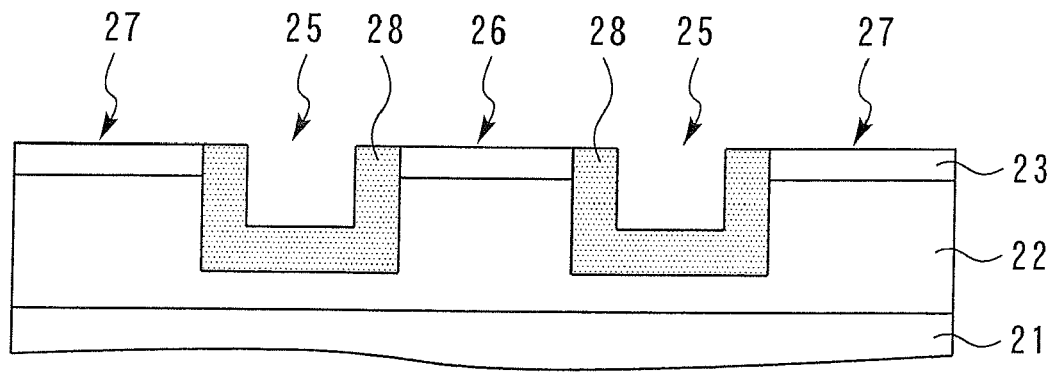

Next, as shown in FIG. 6, the exposed resist 24 is removed with an organic solvent. The resist 24 may be removed by using a sulfuric acid-hydrogen peroxide solution mixture or an $O_2$ asher. Also, application of a lift-off method of simultaneously removing the resist 24 and the $SiO_2$ film 28 formed on the resist 24 by acetone ultrasonic processing is conceivable. However, such a method is not preferable because there is a possibility of a residue of the $SiO_2$ film 28 being generated by ultrasonic processing.

Figure 7:
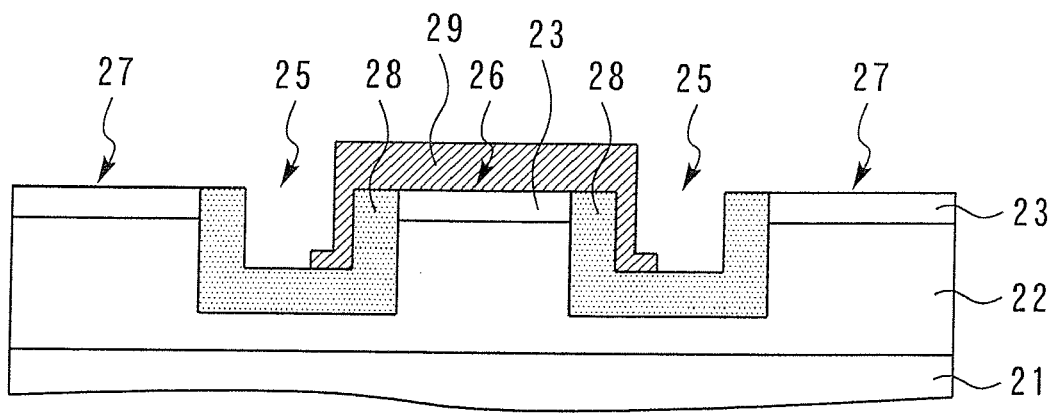

Next, as shown in FIG. 7, AuGa, Au, Pt and Au are successively formed in layers on the contact layer 23 on the top of the waveguide ridge 26 by vacuum vapor deposition to form the p-side electrode 29 (electrode). More specifically, a resist (not shown) is applied to the entire surface and an opening is formed by photolithography on the upper surface of the contact layer 23 being the uppermost layer of the waveguide ridge 26, the side walls of the waveguide ridge 26 and a portion of the bottoms of the channels 25. The p-side electrode 29 is then formed on the entire surface, and the resist and the p-side electrode 29 formed on the resist are removed by lift-off. As a result, the p-side electrode 29 is electrically connected to the contact layer 23 and covers the upper ends of the $SiO_2$ film 28, the $SiO_2$ film 28 on the side walls of the waveguide ridge 26 and a portion of the $SiO_2$ film 28 at the bottoms of the channels 25.

Figure 8:
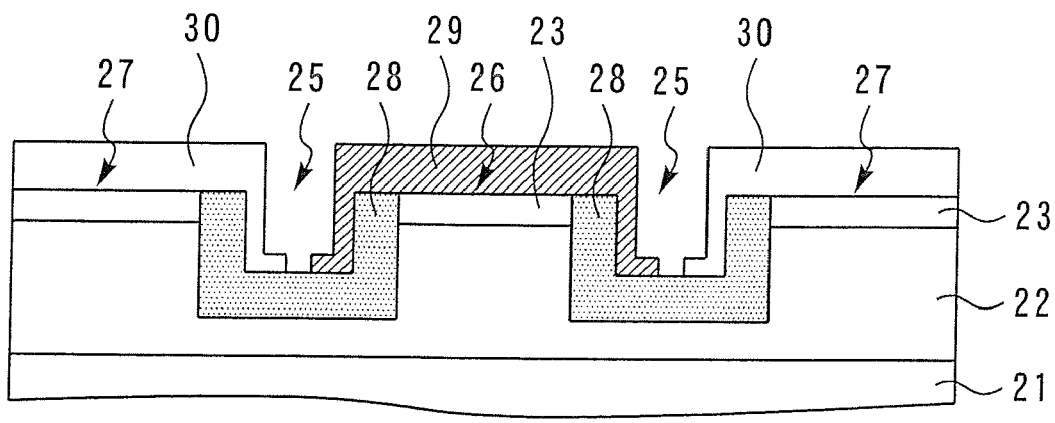

Next, as shown in FIG. 8, an $SiO_2$ film 30 is formed. More specifically, a resist (not shown) is applied to the entire surface and openings are formed by photolithography on portions other than the upper surface of the p-side electrode 29. $SiO_2$ film 30 having a film thickness of 100 nm is then formed on the entire surface by vapor deposition, and the resist formed on the p-side electrode 29 and the $SiO_2$ film 30 formed on the resist are removed by lift-off. As a result, the $SiO_2$ film 30 covers the upper surfaces of the electrode pad bases 27, the $SiO_2$ film 28 on the channel 25 side walls, and a portion of the $SiO_2$ film 28 at the bottoms of the channels 25.

Figure 9:
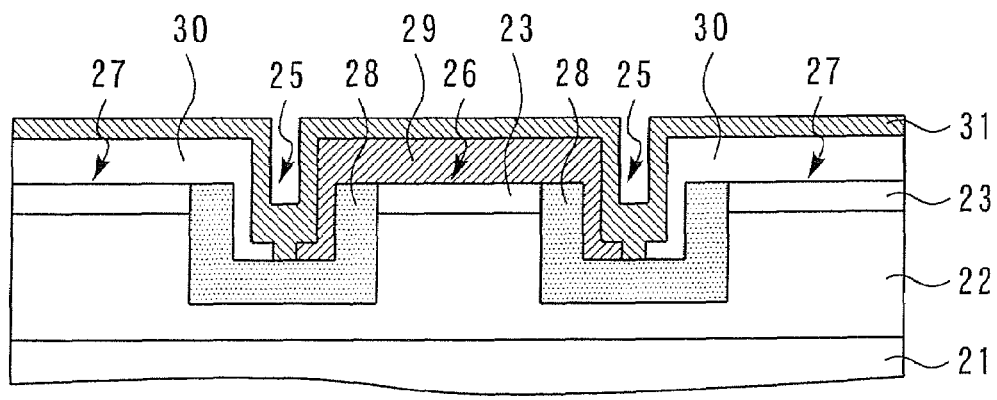

Next, as shown in FIG. 9, Ti, Pt and Au are formed in layers on the p-side electrode 29, the channels 25 and the $SiO_2$ film 30 by vacuum deposition to form a pad electrode 31. The pad electrode 31 is electrically connected to the p-side electrode 29, covers the p-side electrode 29, the $SiO_2$ film 28 and the $SiO_2$ film 30 in the channels 25, and further extends over the upper surfaces of the $SiO_2$ film 30 on the electrode pad bases 27.

Figure 10:
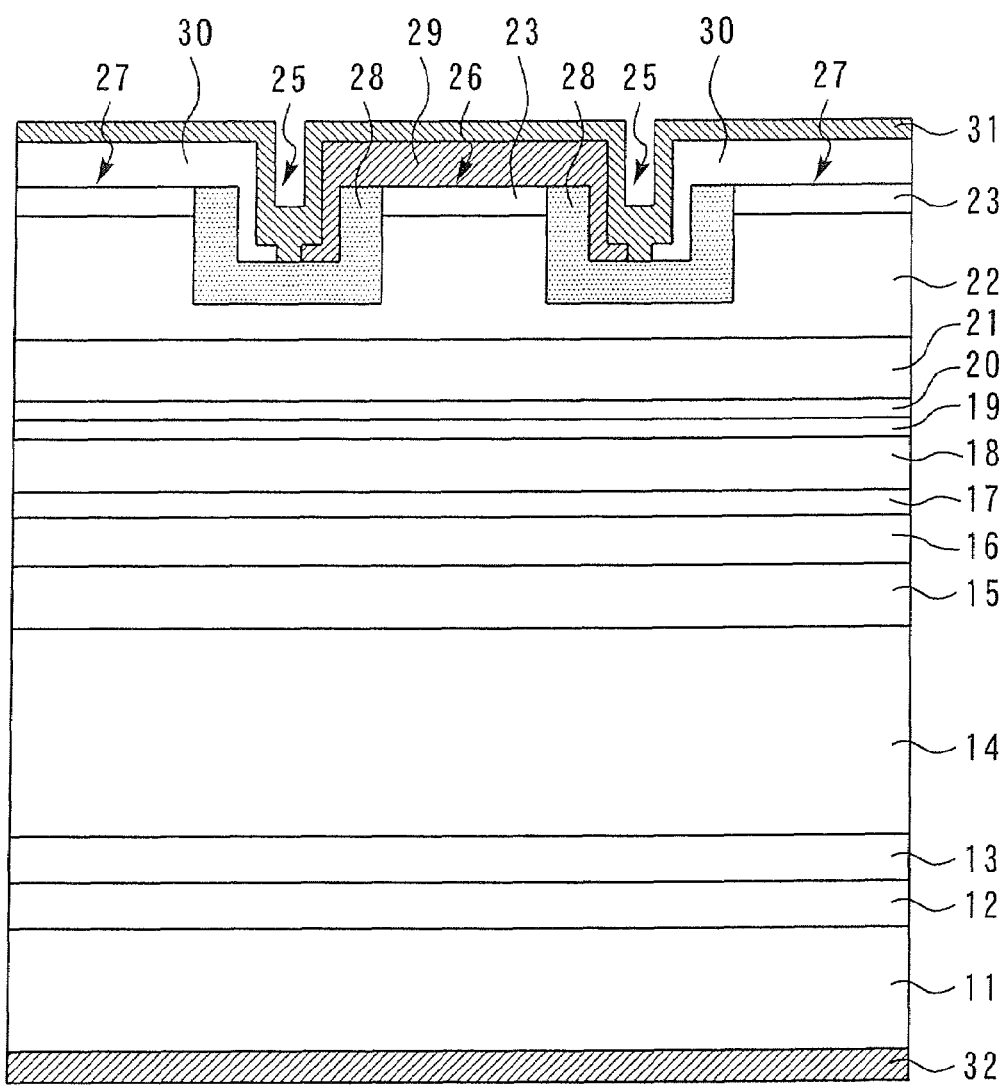

Finally, as shown in FIG. 10, Ti, Pt and Au are successively stacked on the back surface of the n-type GaN substrate 11 to form an n-side electrode 32 by vapor deposition. The waveguide-ridge-type blue-violet laser diode according to the present embodiment is formed by the above-described process.

In the present embodiment, as described above, the $SiO_2$ film 28 is formed in a state where the top of the waveguide ridge 26 is covered with the resist 24 and, therefore, no $SiO_2$ film 28 residue remains on the contact layer 23. Prevention of a reduction in the area of contact between the contact layer 23 on the top of the waveguide ridge 26 and the p-side electrode 29 is thus enabled. Also, since the $SiO_2$ film 28 formed on the resist 24 is removed by utilizing a difference in etching rate, the process is simple. When openings are formed on the SiO2 film 28 by dry etching, the resist 24 remains on the contact layer 23. This resist 24 functions as a protective film and is removed with an organic solvent, thus enabling the contact layer 23 on the top of the waveguide ridge 26 to be prevented from being damaged by dry etching. Thus, prevention of an increase in contact resistance due to a reduction in contact area or damage and, hence, prevention of an increase in operating voltage is enabled.

Insulating film of $SiO_x$ (0<x<2), SiN, SiON, $TiO_2$, $Ta_2O_5$, $Al_2O_3$, AlN, $ZrO_2$, $Nb_2O_5$, MgO, SiC or the like may be used in place of the $SiO_2$ films 28 and 30. While the embodiment has been described with respect a blue-violet LD as a semiconductor optical element, the present invention can be applied to semiconductor optical elements in general including a red LD without being limited to the blue-violet LD.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-055388, filed on Mar. 5, 2008 including specification, claims, drawings and summary, on which the Convention priority of the present application is based, are incorporated herein by reference in its entirety.

What is claimed is:

1. A method of manufacturing a semiconductor optical element, comprising:
   successively stacking a first semiconductor layer of a first conductivity type, an active layer, and a second semiconductor layer of a second conductivity type;
   applying a resist on the second semiconductor layer and patterning the resist into stripes by photolithography;
   forming recesses with the second semiconductor layer at the bottom of the recesses and a waveguide ridge adjacent to the recesses, by dry-etching the second semiconductor layer to a depth only partially through the second semiconductor layer, using the resist as a mask;
   forming an insulating film on the waveguide ridge and in the recesses without removing the resist;
   removing the insulating film on the resist by etching, utilizing a difference in etching rate between the insulating film on the resist and the insulating film in the recesses so that the resist is exposed and the insulating film in the recess is left;
   removing the resist that is exposed; and
   forming an electrode on the waveguide ridge after removing the resist.

2. The method according to claim 1, wherein forming an insulating film includes forming an $SiO_2$ film by sputtering.

* * * * *